(12) United States Patent
Sakamoto et al.

(10) Patent No.: US 10,804,191 B2
(45) Date of Patent: Oct. 13, 2020

(54) PRINTED WIRING BOARD

(71) Applicant: IBIDEN CO., LTD., Ogaki (JP)

(72) Inventors: Hajime Sakamoto, Ogaki (JP); Yoji Sawada, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 75 days.

(21) Appl. No.: 16/157,433

(22) Filed: Oct. 11, 2018

(65) Prior Publication Data
US 2019/0109085 A1 Apr. 11, 2019

(30) Foreign Application Priority Data

Oct. 11, 2017 (JP) .................................. 2017-197983

(51) Int. Cl.
| | |
|---|---|
| H05K 1/00 | (2006.01) |
| H05K 1/18 | (2006.01) |
| H05K 7/00 | (2006.01) |
| H01L 23/498 | (2006.01) |
| H01L 21/48 | (2006.01) |

(52) U.S. Cl.
CPC .. *H01L 23/49838* (2013.01); *H01L 23/49827* (2013.01); *H01L 21/4846* (2013.01)

(58) Field of Classification Search
CPC ........... H01L 21/4846; H01L 23/49827; H01L 23/49838; H05K 1/115; H05K 3/4611
See application file for complete search history.

(56) References Cited

U.S. PATENT DOCUMENTS

| | | | | |
|---|---|---|---|---|
| 2009/0273073 A1* | 11/2009 | Tachibana | ............. | H01L 21/563 257/692 |
| 2014/0027165 A1* | 1/2014 | Morita | ................. | H05K 1/0306 174/258 |
| 2014/0138845 A1* | 5/2014 | Kulkarni | ............... | H01L 23/485 257/774 |
| 2014/0225275 A1* | 8/2014 | Shimizu | ............ | H01L 23/49827 257/774 |
| 2015/0001738 A1* | 1/2015 | Shimizu | ................. | H05K 1/115 257/778 |
| 2015/0107880 A1* | 4/2015 | Kim | ....................... | H05K 1/185 174/255 |

(Continued)

FOREIGN PATENT DOCUMENTS

JP 2014-154800 A 8/2014

*Primary Examiner* — Yuriy Semenenko
(74) *Attorney, Agent, or Firm* — Oblon, McClelland, Maier & Neustadt, L.L.P.

(57) ABSTRACT

A printed wiring board includes a first build-up layer having first insulating layer, conductor layer and via conductor, a second build-up layer formed on the first build-up layer and having second insulating layer, conductor layer and via conductor, a third build-up layer formed on the second build-up layer and having third insulating layer, conductor layer and via conductor, and a fourth build-up layer formed on the third build-up layer and having fourth insulating layer, conductor layer and via conductor. The first insulating layer has a thickness that is larger than a thickness of the second insulating layer, the thickness of the second insulating layer is larger than a thickness of the third insulating layer, the thickness of the second insulating layer is larger than a thickness of the fourth insulating layer, and the thickness of the fourth insulating layer is larger than the thickness of the third insulating layer.

20 Claims, 2 Drawing Sheets

(56) References Cited

U.S. PATENT DOCUMENTS

| | | | |
|---|---|---|---|
| 2016/0105960 A1* | 4/2016 | Sakamoto | H01L 21/486 |
| | | | 361/720 |
| 2016/0143137 A1* | 5/2016 | Baek | H05K 3/4682 |
| | | | 361/767 |
| 2019/0035729 A1* | 1/2019 | Aoki | H01L 23/49827 |
| 2019/0198446 A1* | 6/2019 | Sawada | H01L 25/18 |

* cited by examiner

PRINTED WIRING BOARD

CROSS-REFERENCE TO RELATED APPLICATIONS

The present application is based upon and claims the benefit of priority to Japanese Patent Application No. 2017-197983, filed Oct. 11, 2017, the entire contents of which are incorporated herein by reference.

BACKGROUND OF THE INVENTION

Field of the Invention

The present invention relates to a printed wiring board having a first build-up layer, a second build-up layer, a third build-up layer and a fourth build-up layer.

Description of Background Art

Japanese Patent Laid-Open Publication No. 2014-154800 describes a wiring board which includes a base wiring board and a re-wiring part formed on the base wiring board. The entire contents of this publication are incorporated herein by reference.

SUMMARY OF THE INVENTION

According to one aspect of the present invention, a printed wiring board includes a first build-up layer having a first resin insulating layer, a first conductor layer formed on the first resin insulating layer, and a first via conductor penetrating through the first resin insulating layer and connecting to the first conductor layer, a second build-up layer formed on the first build-up layer and having a second resin insulating layer, a second conductor layer formed on the second resin insulating layer, and a second via conductor penetrating through the second resin insulating layer and connecting to the second conductor layer, a third build-up layer formed on the second build-up layer and having a third resin insulating layer, a third conductor layer formed on the third resin insulating layer, and a third via conductor penetrating through the third resin insulating layer and connecting to the third conductor layer, and a fourth build-up layer formed on the third build-up layer and having a fourth resin insulating layer, a fourth conductor layer formed on the fourth resin insulating layer, and a fourth via conductor penetrating through the fourth resin insulating layer and connecting to the fourth conductor layer. The first resin insulating layer has a thickness that is larger than a thickness of the second resin insulating layer, the thickness of the second resin insulating layer is larger than a thickness of the third resin insulating layer, the thickness of the second resin insulating layer is larger than a thickness of the fourth resin insulating layer, and the thickness of the fourth resin insulating layer is larger than the thickness of the third resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
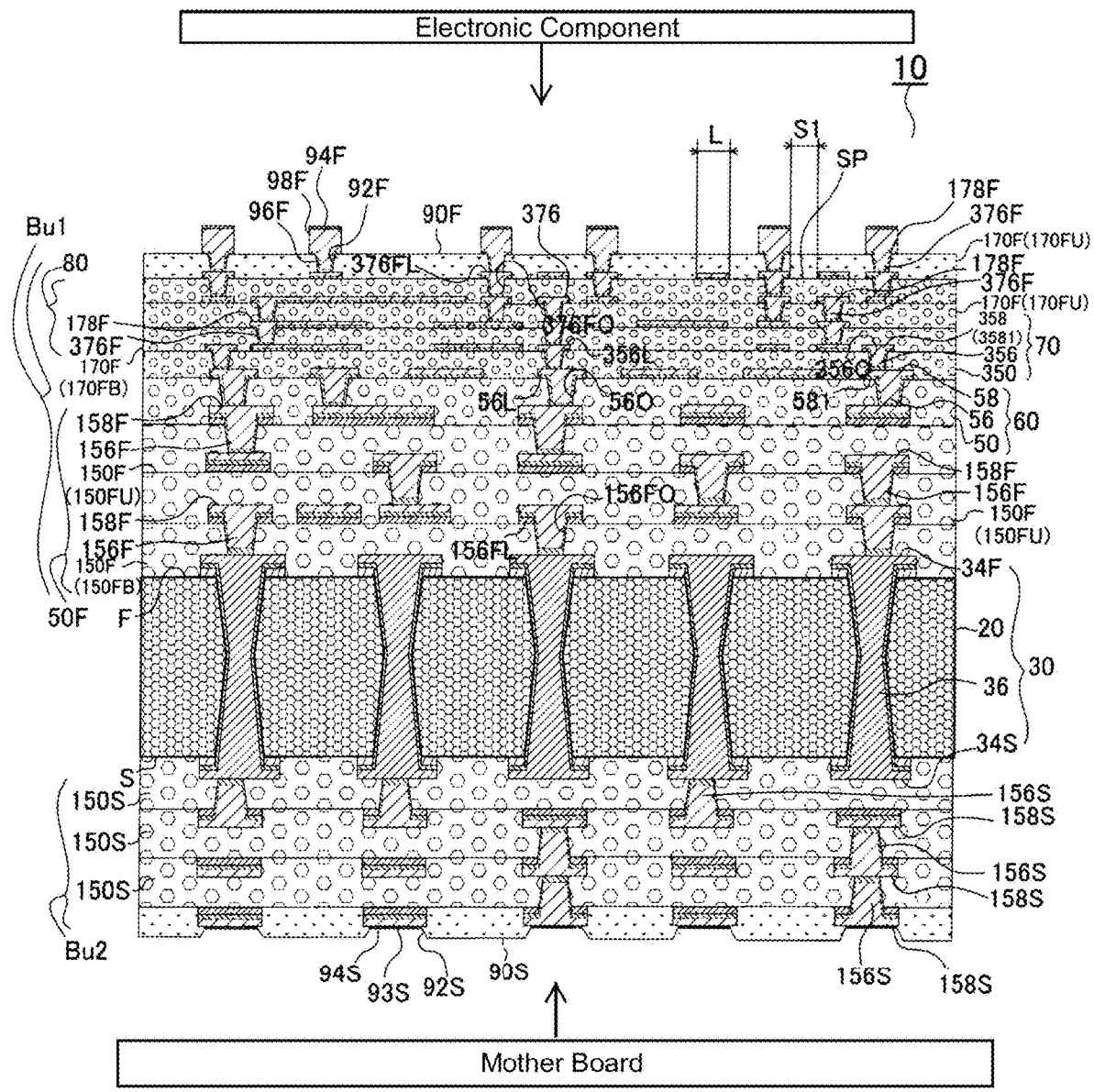
FIG. 1 is a cross-sectional view of a printed wiring board according to an embodiment of the present invention.

Embodiments will now be described with reference to the accompanying drawings, wherein like reference numerals designate corresponding or identical elements throughout the various drawings.

Embodiment

FIG. 1 illustrates a cross section of a printed wiring board 10 of an embodiment.

The printed wiring board 10 has a core substrate 30 having a first surface (F) and a second surface (S) on an opposite side with respect to the first surface (F), an upper side build-up layer (Bu1) formed on the first surface (F) of the core substrate 30, and a lower side build-up layer (Bu2) formed on the second surface (S) of the core substrate 30.

The printed wiring board 10 further has a first solder resist layer (90F) formed on the upper side build-up layer (Bu1) and a second solder resist layer (90S) formed on the lower side build-up layer (Bu2).

The upper side build-up layer (Bu1) is formed by a first build-up layer (50F) formed on the first surface (F) of the core substrate 30, a second build-up layer 60 formed on the first build-up layer (50F), a third build-up layer 70 formed on the second build-up layer 60, and a fourth build-up layer 80 formed on the third build-up layer 70.

The core substrate 30 has a core layer 20 having a first surface (F) and a second surface (S) on an opposite side with respect to the first surface (F), a sixth conductor layer (34F) formed on the first surface (F) of the core layer 20, and a seventh conductor layer (34S) formed on the second surface (S) of the core layer 20. The core substrate further has through-hole conductors 36 penetrating the core layer 20. The sixth conductor layer (34F) and the seventh conductor layer (34S) are connected to each other via the through-hole conductors 36.

The first build-up layer (50F) has first resin insulating layers (150F) formed on the first surface (F) of the core substrate 30 and on the sixth conductor layer (34F), first conductor layers (158F) that are respectively formed on the first resin insulating layers (150F), and first via conductors (156F) that penetrate the first resin insulating layers (150F) and connect to the first conductor layers (158F). The first conductor layers (158F) have first via lands (156FL) that are respectively formed directly on the first via conductors (156F). The first via lands (156FL) are respectively formed directly on the first via conductors (156F) and around the first via conductors (156F). The first via lands (156FL) are respectively simultaneously and integrally formed with the first via conductors (156F). The first via conductors (156F) are respectively formed in openings (156FO) that are formed for the first via conductors (156F) and penetrate the first resin insulating layers (150F). The number of the first resin insulating layers (150F) and the number of the first conductor layers (158F) are preferably each at least 2. Warpage of the upper side build-up layer (Bu1) can be reduced. Stress concentration in the upper side build-up layer (Bu1) can be suppressed. In the example of FIG. 1, the number of the first resin insulating layers (150F) and the number of the first conductor layers (158F) are each at least 2. The number of the first resin insulating layers (150F) is 3, and the number of the first conductor layers (158F) is 3. The number of the first resin insulating layers (150F) and the number of the first conductor layers (158F) are preferably each 6. The first resin insulating layers (150F) and the first conductor layers (158F) are alternately laminated. When the number of the first resin insulating layers (150F) is at least 2, the first via conductors (156F) are respectively formed in respective first resin insulating layers (150F). The conductor layers sandwiching the first resin insulating layers (150F) therebetween are connected to each other by the first via conductors (156F).

When the number of the first resin insulating layers is at least 2, the first build-up layer (50F) has a first resin insulating layer (150FB) formed directly on the core substrate 30 (the first resin insulating layer on the core substrate) and the other first resin insulating layers (upper side first resin insulating layers) (150FU). The upper side first resin insulating layers (150FU) are sandwiched between the first conductor layers (158F), and the first resin insulating layer (150FB) on the core substrate is sandwiched between the first conductor layer (158F) and the sixth conductor layer (34F). The first via conductors (156F) penetrating the upper side first resin insulating layers (150FU) connect adjacent first conductor layers (158F) to each other. The first via conductors (156F) penetrating the first resin insulating layer (150FB) on the core substrate connect the first conductor layer (158F) and the sixth conductor layer (34F) to each other.

The second build-up layer 60 has a second resin insulating layer 50 that is formed on the first resin insulating layer (150F) and the first conductor layer (158F) that form the first build-up layer (50F), a second conductor layer 58 that is formed on the second resin insulating layer 50, and second via conductors 56 that penetrate the second resin insulating layer 50 and connect to the second conductor layer 58. The second conductor layer 58 has second via lands (56L) that are respectively formed directly on the second via conductors 56. The second via lands (56L) are respectively formed directly on the second via conductors 56 and around the second via conductors 56. The second via conductors 56 are respectively simultaneously and integrally formed with the second via lands (56L). The second via conductors 56 are respectively formed in openings (560) that are formed for the second via conductors 56 and penetrate the second resin insulating layer 50. The first conductor layer (158F) and the second conductor layer 58 are connected to each other by the second via conductors 56.

The second build-up layer 60 is sandwiched between the first build-up layer (50F) and the third build-up layer 70. The second build-up layer 60 is laminated directly on the first build-up layer (50F). Preferably, there is only one second resin insulating layer 50 forming the second build-up layer 60. Preferably, there is only one second conductor layer 58 forming the second build-up layer 60. In this case, the first conductor layer (158F) and the second conductor layer 58 are directly connected to each other via the second via conductors 56. A thickness of the upper side build-up layer (Bu1) can be reduced. A stress in the upper side build-up layer (Bu1) can be reduced.

The third build-up layer 70 has a third resin insulating layer 350 that is formed on the second resin insulating layer 50 and the second conductor layer 58 that form the second build-up layer 60, a third conductor layer 358 that is formed on the third resin insulating layer 350, and third via conductors 356 that penetrate the third resin insulating layer 350 and connect to the third conductor layer 358. The third conductor layer 358 has third via lands (356L) that are respectively formed directly on the third via conductors 356. The third via lands (356L) are respectively formed directly on the third via conductors 356 and around the third via conductors 356. The third via conductors 356 are respectively simultaneously and integrally formed with the third via lands (356L). The third via conductors 356 are respectively formed in openings (3560) that are formed for the third via conductors 356 and penetrate the third resin insulating layer 350. The second conductor layer 58 and the third conductor layer 358 are connected to each other by the third via conductors 356.

The third build-up layer 70 is sandwiched between the second build-up layer 60 and the fourth build-up layer 80. The third build-up layer 70 is laminated directly on the second build-up layer 60. Preferably, there is only one third resin insulating layer 350 forming the third build-up layer 70. Preferably, there is only one third conductor layer 358 forming the third build-up layer 70. In this case, the second conductor layer 58 and the third conductor layer 358 are directly connected to each other via the third via conductors 356. A thickness of the upper side build-up layer (Bu1) can be reduced. A stress in the upper side build-up layer (Bu1) can be reduced.

The fourth build-up layer 80 has fourth resin insulating layers (170F) that are formed on the third resin insulating layer 350 and the third conductor layer 358 that form the third build-up layer 70, fourth conductor layers (178F) that are respectively formed on the fourth resin insulating layers (170F), and fourth via conductors (376F) that penetrate the fourth resin insulating layers (170F) and connect to the fourth conductor layers (178F). The fourth conductor layers (178F) have fourth via lands (376FL) that are respectively formed directly on the fourth via conductors (376F). The fourth via lands (376FL) are respectively formed directly on the fourth via conductors (376F) and around the fourth via conductors (376F). The fourth via conductors (376F) are respectively simultaneously and integrally formed with the fourth via lands (376FL). The fourth via conductors (376F) are respectively formed in openings (376FO) that are formed for the fourth via conductors (376F) and penetrate the fourth resin insulating layers (170F). The number of the fourth resin insulating layers (170F) and the number of the fourth conductor layers (178F) are preferably each at least 2. Warpage of the upper side build-up layer (Bu1) can be reduced. Stress concentration in the upper side build-up layer (Bu1) can be suppressed. In the example of FIG. 1, the number of the fourth resin insulating layers (170F) and the number of the fourth conductor layers (178F) are each at least 2. The number of the fourth resin insulating layers (170F) is 3, and the number of the fourth conductor layers (178F) is 3. The number of the fourth resin insulating layers (170F) and the number of the fourth conductor layers (178F) are preferably each 6. The fourth resin insulating layers (170F) and the fourth conductor layers (178F) are alternately laminated. When the number of the fourth resin insulating layers (170F) is at least 2, the fourth via conductors (376F) are respectively formed in respective fourth resin insulating layers (170F). The conductor layers sandwiching the fourth resin insulating layers (170F) therebetween are connected to each other by the fourth via conductors (376F). The fourth build-up layer 80 is laminated directly on the third build-up layer 70.

When the number of the fourth resin insulating layers is at least 2, the fourth build-up layer 80 has a fourth resin insulating layer (170FB) formed directly on the third build-up layer 70 (the fourth resin insulating layer on the third build-up layer) and the other fourth resin insulating layers (upper side fourth resin insulating layers) (170FU). The upper side fourth resin insulating layers (170FU) are sandwiched between the fourth conductor layers (178F), and the fourth resin insulating layer (170FB) on the third build-up layer is sandwiched between the fourth conductor layer (178F) and the third conductor layer 358. The fourth via conductors (376F) penetrating the upper side fourth resin insulating layers (170FU) connect adjacent fourth conductor layers (178F) to each other. The fourth via conductors (376F) penetrating the fourth resin insulating layer (170FB) on the third build-up layer connect the third conductor layer 358 and the fourth conductor layer (178F) to each other.

The first solder resist layer (90F) is formed on the fourth build-up layer 80. The first solder resist layer (90F) has first openings (92F) exposing the fourth conductor layer (178F).

The printed wiring board 10 has metal posts (98F) on the fourth conductor layer (178F) exposed from the first openings (92F) of the first solder resist layer (90F). An electronic component such as an IC chip is mounted on the metal posts (98F). A metal film (94F) composed of Ni/Pd/Au is formed on an upper surface of each of the metal posts (98F).

The lower side build-up layer (Bu2) has fifth resin insulating layers (150S) that are formed on the second surface (S) of the core substrate 30 and on the seventh conductor layer (34S), fifth conductor layers (158S) that are respectively formed on the fifth resin insulating layers (150S), and fifth via conductors (156S) that penetrate the fifth resin insulating layers (150S) and connect to the fifth conductor layers (158S). The number of the fifth resin insulating layers (150S) and the number of the fifth conductor layers (158S) are preferably each at least 2. Warpage of the lower side build-up layer (Bu2) can be reduced. Stress concentration in the lower side build-up layer (Bu2) can be suppressed. In the example of FIG. 1, the number of the fifth resin insulating layers (150S) and the number of the fifth conductor layers (158S) are each at least 2. The number of the fifth resin insulating layers (150S) is 3, and the number of the fifth conductor layers (158S) is 3. The number of the resin insulating layers (first resin insulating layers) (150F) forming the first build-up layer (50F) is the same as the number of the resin insulating layers (fifth resin insulating layers) (150S) forming the lower side build-up layer (Bu2). The number of the conductor layers (first conductor layers) (158F) forming the first build-up layer (50F) is the same as the number of the conductor layers (fifth conductor layers) (158S) forming the lower side build-up layer (Bu2). The fifth resin insulating layers (150S) and the fifth conductor layers (158S) are alternately laminated. When the number of the fifth resin insulating layers (150S) is at least 2, the fifth via conductors (156S) are respectively formed in respective fifth resin insulating layers (150S). The conductor layers sandwiching the fifth resin insulating layers (150S) therebetween are connected to each other by the fifth via conductors (156S).

The second solder resist layer (90S) having second openings (92S) is formed on the lower side build-up layer (Bu2). The fifth conductor layer (158S) exposed from the second openings (92S) forms second pads (93S) for connecting to a motherboard. A metal film (94S) is formed on an upper surface of each of the second pads (93S).

When the printed wiring board 10 is manufactured, the printed wiring board 10 is pressed. The printed wiring board 10 is heated. Due to these processes, for example, the printed wiring board 10 has a residual stress. In the embodiment, the second build-up layer 60 is formed on the first build-up layer (50F). Then, the third build-up layer 70 is formed on the second build-up layer 60. The fourth build-up layer 80 is formed on the third build-up layer 70. Therefore, the first build-up layer (50F) receives more processing than the second build-up layer 60. The second build-up layer 60 receives more processing than the third build-up layer 70.

The third build-up layer 70 receives more processing than the fourth build-up layer 80. Therefore, a magnitude of a residual stress accumulated in the first build-up layer (50F) is thought to be larger than a magnitude of a residual stress accumulated in the second build-up layer 60. The magnitude of the residual stress accumulated in the second build-up layer 60 is thought to be larger than a magnitude of a residual stress accumulated in the third build-up layer 70. The magnitude of the residual stress accumulated in the third build-up layer 70 is thought to be larger than a magnitude of a residual stress accumulated in the fourth build-up layer 80.

Then, a residual stress is thought to be released in a form of heat or the like. In this case, a stress is expected to be release from the first build-up layer (50F) toward the third build-up layer 70. Or, a stress is expected to be release from the first build-up layer (50F) toward the fourth build-up layer 80. This is thought to be because the residual stress is reduced from the first build-up layer (50F) toward the third build-up layer 70. Or, this is thought to be because the stress decreases from the first build-up layer (50F) toward the fourth build-up layer 80.

When the third build-up layer 70 is laminated directly on the first build-up layer (50F), a residual stress in the first build-up layer (50F) is thought to be directly transmitted to the via conductors, the conductor layers and the resin insulating layers that formed the third build-up layer 70. Therefore, the via conductors, the conductor layers and the resin insulating layers that formed the third build-up layer 70 are expected to receive a large stress. In contrast, in the printed wiring board 10 of the embodiment, the third build-up layer 70 is laminated on the first build-up layer (50F) via the second build-up layer 60. Therefore, the second build-up layer 60 serves as a buffer layer. In the embodiment, a residual stress in the first build-up layer (50F) is transmitted to the second build-up layer 60. Then, the stress is relaxed by the second build-up layer 60. Thereafter, the stress is transmitted to the via conductors, the conductor layers and the resin insulating layers that form the third build-up layer 70. According to the embodiment, a magnitude of a stress transmitted to the via conductors, the conductor layer and the resin insulating layer that form the third build-up layer 70 is reduced. Reliability of the third build-up layer 70 is unlikely to decrease.

When the fourth build-up layer 80 is laminated directly on the first build-up layer (50F), a residual stress in the first build-up layer (50F) is thought to be directly transmitted to the via conductors, the conductor layers and the resin insulating layers that formed the fourth build-up layer 80. Therefore, the via conductors, the conductor layers and the resin insulating layers that formed the fourth build-up layer 80 are expected to receive a large stress. In contrast, in the printed wiring board 10 of the embodiment, the fourth build-up layer 80 is laminated on the first build-up layer (S0F) via the second build-up layer 60 and the third build-up layer 70. Therefore, the second build-up layer 60 and the third build-up layer 70 serve as buffer layers. In the embodiment, a residual stress in the first build-up layer (50F) reaches the second build-up layer 60. Then, the stress is relaxed by the second build-up layer 60. Further, the stress reaches the third build-up layer 70 and is relaxed by the third build-up layer 70. Thereafter, the stress is transmitted to the via conductors, the conductor layers and the resin insulating layers that form the fourth build-up layer 80. According to the embodiment, a magnitude of a stress transmitted to the via conductors, the conductor layer and the resin insulating layer that form the fourth build-up layer 80 is reduced. Reliability of the fourth build-up layer 80 is unlikely to decrease.

Figure 2:
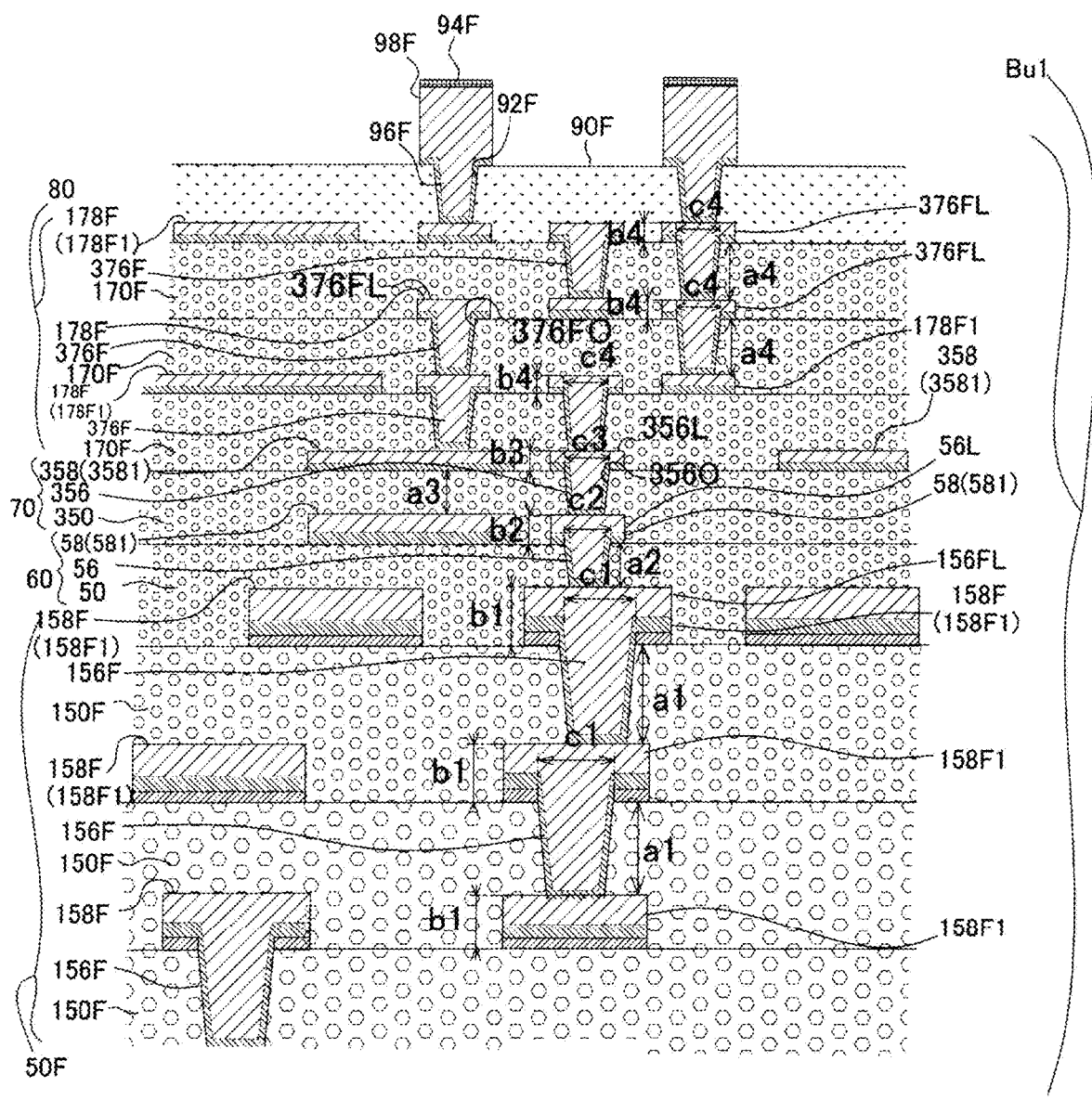
FIG. 2 is an enlarged view of the printed wiring board of the embodiment.

FIG. 2 is an enlarged view of the upper side build-up layer (Bu1).

The first conductor layers (158F) are each formed of multiple first conductor circuits (158F1). A thickness of each of the first conductor circuits (158F1) is a thickness (b1). The second conductor layer 58 is formed of multiple second conductor circuits 581. A thickness of each of the second conductor circuits 581 is a thickness (b2). The third conductor layer 358 is formed of multiple third conductor circuits 3581. A thickness of each of the third conductor circuits 3581 is a thickness (b3). The fourth conductor layers (178F) are each formed of multiple fourth conductor circuits (178F1). A thickness of each of the fourth conductor circuits (178F1) is a thickness (b4). The thickness (b1) of each of the first conductor circuits (158F1) is larger than the thickness (b2) of each of the second conductor circuits 581. The thickness (b2) of each of the second conductor circuits 581 is larger than the thickness (b3) of each of the third conductor circuits 3581. The thickness (b2) of each of the second conductor circuits 581 is larger than the thickness (b4) of each of the fourth conductor circuits (178F1). The thickness (b3) of each of the third conductor circuits 3581 is equal to the thickness (b4) of each of the fourth conductor circuits (178F1). Or, the thickness (b3) of each of the third conductor circuits 3581 is smaller than the thickness (b4) of each of the fourth conductor circuits (178F1). Or, the thickness (b3) of each of the third conductor circuits 3581 is larger than the thickness (b4) of each of the fourth conductor circuits (178F1). The thickness (b3) is preferably the smallest among the thickness (b1), the thickness (b2), the thickness (b3) and the thickness (b4).

When a thickness of a conductor layer is small, strength of the conductor layer decreases. Even when magnitudes of stresses in the conductor circuits are the same, magnitudes of stresses per unit cross-sectional area are different depending on the thicknesses of the conductor circuits. Therefore, when a stress in the first build-up layer (50F) is transmitted to the third build-up layer 70, the magnitude of the stress per unit cross-sectional area in the first conductor circuits (158F1) is different from the magnitude of the stress per unit cross-sectional area in the third conductor circuits 3581. The thickness (b3) is smaller than the thickness (b1). The magnitude of the stress per unit cross-sectional area in the third conductor circuits 3581 is larger than the magnitude of the stress per unit cross-sectional area in the first conductor circuits (158F1). When a defect occurs in the conductor layers formed in the upper side build-up layer (Bu1), a disconnection in the third conductor layer 358 is likely to occur. However, since the printed wiring board 10 of the embodiment has the second build-up layer 60, a stress can be relaxed by the second build-up layer 60. Occurrence of a disconnection in the third conductor layer 358 can be suppressed.

When a stress in the first build-up layer (50F) is transmitted to the fourth build-up layer 80, the magnitude of the stress per unit cross-sectional area in the first conductor circuits (158F1) is different from the magnitude of the stress per unit cross-sectional area in the fourth conductor circuits (178F1). The thickness (b4) is smaller than the thickness (b1). The magnitude of the stress per unit cross-sectional area in the fourth conductor circuits (178F1) is larger than the magnitude of the stress per unit cross-sectional area in the first conductor circuits (158F1). When a defect occurs in the conductor layers formed in the upper side build-up layer (Bu1), a disconnection in the fourth conductor layers (178F) is likely to occur. However, since the printed wiring board 10 of the embodiment has the second build-up layer 60 and the third build-up layer 70, a stress can be relaxed by the second build-up layer 60. A stress can be relaxed by the third build-up layer 70. Occurrence of a disconnection in the fourth conductor layers (178F) can be suppressed.

When the thickness (b3) is the smallest among the thickness (bp, the thickness (b2), the thickness (b3) and the thickness (b4), the magnitude of the stress in the third conductor circuits 3581 is thought to be the largest among the magnitude of the stress in the first conductor circuits (158F1), the magnitude of the stress in the second conductor circuits 581, the magnitude of the stress in the third conductor circuits 3581, and the magnitude of the stress in the fourth conductor circuits (178F1). A disconnection in the third conductor layer 358 is expected. However, in the embodiment, since the third conductor layer 358 is sandwiched between the third resin insulating layer 350 and the fourth resin insulating layer (170F), occurrence of a disconnection in the third conductor layer 358 can be effectively prevented.

When the thickness (b3) is equal to the thickness (b4), even when a stress in the third conductor circuits 3581 is transmitted to the fourth conductor circuits (178F1), a change in the magnitude of the stress is thought to be small. It is thought that the fourth conductor layers (178F) do not receive a large shock. Occurrence of a disconnection in the fourth conductor layers (178F) can be effectively prevented.

When the thickness (b1) is larger than the thickness (b2), the thickness (b2) is larger than the thickness (b3), and the thickness (b3) is larger than the thickness (b4), the magnitude of the stress decreases stepwise from the first conductor layers (158F) toward the fourth conductor layers (178F). Or, the magnitude of the stress gradually decreases. Occurrence of a disconnection in the conductor layers (158F, 58, 358, 178F) can be effectively prevented.

A ratio (b1/b2) of the thickness (b1) to the thickness (b2) is 1.5 or more and 3.5 or less. The ratio (b1/b2) is preferably 2 or more. A ratio (b2/b3) of the thickness (b2) to the thickness (b3) is 1.2 or more and 2 or less. The ratio (b2/b3) is preferably 1.5 or more. A ratio (b3/b4) of the thickness (b3) to the thickness (b4) is 0.8 or more and 2 or less. The ratio (b3/b4) is preferably 1.0 or more and 1.5 or less. Occurrence of a disconnection in the third conductor layer 358 can be suppressed. Occurrence of a disconnection in the fourth conductor layers (178F) can be suppressed.

The thickness (b4) is 2 µm or more and 4 µm or less. The thickness (b3) is preferably 2 µm or more and 5 µm or less. The thickness (b2) is 4 µm or more and 10 µm or less. The thickness (b1) is 12 µm or more and 18 µm or less. Occurrence of a disconnection in the third conductor layer 358 or the fourth conductor layers (178F) can be suppressed.

As illustrated in FIG. 2, the first via conductors (156F) have a diameter (c1) of the first via conductors (156F) at interfaces between the first via lands (156FL) and the first via conductors (156F). The interfaces between the first via lands (156FL) and the first via conductors (156F) match with interfaces between the first resin insulating layers (150F) and the first conductor layers (158F).

As illustrated in FIG. 2, the second via conductors 56 have a diameter (c2) of the second via conductors 56 at interfaces between the second via lands (56L) and the second via conductors 56. The interfaces between the second via lands (56L) and the second via conductors 56 match with an interface between the second resin insulating layer 50 and the second conductor layer 58.

As illustrated in FIG. 2, the third via conductors 356 have a diameter (c3) of the third via conductors 356 at interfaces between the third via lands (356L) and the third via conductors 356. The interfaces between the third via lands (356L) and the third via conductors 356 match with an interface between the third resin insulating layer 350 and the third conductor layer 358.

As illustrated in FIG. 2, the fourth via conductors (376F) have a diameter (c4) of the fourth via conductors (376F) at interfaces between the fourth via lands (376FL) and the fourth via conductors (376F). The interfaces between the fourth via lands (376FL) and the fourth via conductors (376F) match with interfaces between the fourth resin insulating layers (170F) and the fourth conductor layers (178F).

The diameter (c1) is larger than the diameter (c2). The diameter (c2) is larger than the diameter (c3). The diameter (c3) is substantially equal to the diameter (c4). The diameter (c3) is the smallest among the diameter (c1), the diameter (c2) and the diameter (c3). The diameter (c4) is the smallest among the diameter (c1), the diameter (c2) and the diameter (c4).

The first via conductors (156F) are formed on the sixth conductor layer (34F) or on the first conductor layers (158F). The first via conductors (156F) are respectively formed in the openings reaching the sixth conductor layer (34F) or in the openings reaching the first conductor layers (158F).

The second via conductors 56 are formed on the first conductor layer (158F). The second via conductors 56 are respectively formed in the openings reaching the first conductor layer (158F).

The third via conductors 356 are formed on the second conductor layer 58. The third via conductors 356 are respectively formed in the openings reaching the second conductor layer 58.

The fourth via conductors (376F) are formed on the third conductor layer 358 or on the fourth conductor layers (178F). The fourth via conductors (376F) are respectively formed in the openings reaching the third conductor layer 358 or in the openings reaching the fourth conductor layers (178F).

When the diameter of the via conductors is small, a bonding strength between the via conductors and the conductor layers becomes small. The bonding strength between the first via conductors (156F) and the sixth conductor layer (34F) is larger than the bonding strength between the second via conductors 56 and the first conductor layer (158F). The bonding strength between the first via conductors (156F) and the first conductor layers (158F) is larger than the bonding strength between the second via conductors 56 and the first conductor layer (158F). The bonding strength between the second via conductors 56 and the first conductor layer (158F) is larger than the bonding strength between the third via conductors 356 and the second conductor layer 58. The bonding strength between the second via conductors 56 and the first conductor layer (158F) is larger than the bonding strength between the fourth via conductors (376F) and the third conductor layer 358. The bonding strength between the second via conductors 56 and the first conductor layer (158F) is larger than the bonding strength between the fourth via conductors (376F) and the fourth conductor layers (178F). Therefore, connection reliability between the third via conductors 356 and the second conductor layer 58 is likely to decrease. Connection reliability between the fourth via conductors (376F) and the third conductor layer 358 is likely to decrease. Connection reliability between the fourth via conductors (376F) and the fourth conductor layers (178F) is likely to decrease.

Even when magnitudes of stresses in the via conductors are the same, magnitudes of stresses per unit cross-sectional area are different depending on the diameters of the via conductors. Therefore, when a stress in the first build-up layer (50F) is transmitted to the third build-up layer 70, the magnitude of the stress per unit cross-sectional area in the first via conductors (156F) is different from the magnitude of the stress per unit cross-sectional area in the third via conductors 356. The diameter (c3) is smaller than the diameter (c1). The magnitude of the stress per unit cross-sectional area in the third via conductors 356 is larger than the magnitude of the stress per unit cross-sectional area in the first via conductors (156F). When a defect occurs in the via conductors formed in the upper side build-up layer (Bu1), connection reliability between the third via conductors 356 and the second conductor layer 58 is likely to decrease. However, since the printed wiring board 10 of the embodiment has the second build-up layer 60, a stress can be relaxed by the second build-up layer 60. The connection reliability between the third via conductors 356 and the second conductor layer 58 is unlikely to decrease.

When a stress in the first build-up layer (50F) is transmitted to the fourth build-up layer 80, the magnitude of the stress per unit cross-sectional area in the first via conductors (156F) is different from the magnitude of the stress per unit cross-sectional area in the fourth via conductors (376F). The diameter (c4) is smaller than the diameter (c1). The magnitude of the stress per unit cross-sectional area in the fourth via conductors (376F) is larger than the magnitude of the stress per unit cross-sectional area in the first via conductors (156F). When a defect occurs in the via conductors formed in the upper side build-up layer (Bu1), connection reliability between the fourth via conductors (376F) and the third conductor layer 358 is likely to decrease. Connection reliability between the fourth via conductors (376F) and the fourth conductor layers (178F) is likely to decrease. However, since the printed wiring board 10 of the embodiment has the second build-up layer 60, a stress can be relaxed by the second build-up layer 60. Since the printed wiring board 10 of the embodiment has the third build-up layer 70, a stress can be relaxed by the third build-up layer 70. The connection reliability between the fourth via conductors (376F) and the third conductor layer 358 is unlikely to decrease. The connection reliability between the fourth via conductors (376F) and the fourth conductor layers (178F) is unlikely to decrease.

A ratio (c1/c2) of the diameter (c1) to the diameter (c2) is 1.5 or more and 2.5 or less. The ratio (c1/c2) is preferably 2.0 or more. A ratio (c2/c3) of the diameter (c2) to the diameter (c3) is 2 or more and 3 or less. The ratio (c2/c3) is preferably 2.2 or more and 2.7 or less. A ratio (c2/c4) of the diameter (c2) to the diameter (c4) is 2 or more and 3 or less. The ratio (c2/c4) is preferably 2.2 or more and 2.7 or less. A ratio (c3/c4) of the diameter (c3) to the diameter (c4) is 0.95 or more and 1.05 or less.

It is preferable that the ratio (c1/c2) be 2.0, the ratio (c2/c3) be 2.5, the ratio (c2/c4) be 2.5, and the ratio (c3/c4) be 1.0. The connection reliability between the third via conductors (376F) and the second conductor layer 58 can be increased. The connection reliability between the fourth via conductors (376F) and the third conductor layer 358 can be increased. The connection reliability between the fourth via conductors (376F) and the fourth conductor layers (178F) can be increased.

The diameter (c1) is 40 μm or more and 60 μm or less. The diameter (c2) is 20 μm or more and 30 μm or less. The diameter (c3) is 5 μm or more and 15 μm or less. The diameter (c4) is 5 µm or more and 15 µm or less. The connection reliability between the third via conductors 356 and the second conductor layer 58 can be increased. The connection reliability between the fourth via conductors (376F) and the third conductor layer 358 can be increased. The connection reliability between the fourth via conductors (376F) and the fourth conductor layers (178F) can be increased.

In the printed wiring board 10 of the embodiment, the via conductors are reduced in diameter stepwise from the first build-up layer (50F) toward the third build-up layer 70. A stress is reduced stepwise. The via conductors are gradually reduced in diameter. A stress is gradually reduced. A defect caused by the third via conductors 356 can be effectively suppressed.

In the printed wiring board 10 of the embodiment, the via conductors are reduced in diameter stepwise from the first build-up layer (50F) toward the third build-up layer 70. Therefore, a magnitude of a stress reaching the fourth via conductors (376F) via the third build-up layer 70 is reduced stepwise between the first build-up layer (50F) and the third build-up layer 70.

In the printed wiring board 10 of the embodiment, the via conductors are gradually reduced in diameter from the first build-up layer (50F) toward the third build-up layer 70. Therefore, the magnitude of the stress reaching the fourth via conductors (376F) via the third build-up layer 70 is gradually reduced between the first build-up layer (50F) and the third build-up layer 70.

Then, the diameter (c4) of the fourth via conductors in the fourth build-up layer 80 is about the same as the diameter (c3) of the third via conductors in the third build-up layer 70. Therefore, the magnitude of the stress per unit cross-sectional area in the third via conductors 356 is about the same as the magnitude of the stress per unit cross-sectional area in the fourth via conductors (376F). The stress is unlikely to concentrate on the third via conductors 356. Or, the stress is unlikely to concentrate on the fourth via conductors (376F). A defect caused by the fourth via conductors 376F can be effectively suppressed.

When the number of the fourth resin insulating layers (170F) is 3 or more, the stress can be effectively dispersed. A defect caused by the third via conductors 356 and the fourth via conductors (376F) can be effectively suppressed.

As illustrated in FIG. 2, the first resin insulating layers (150F) each have a thickness (a1). As illustrated in FIG. 2, the thickness (a1) is a distance between adjacent first conductor layers (158F).

As illustrated in FIG. 2, the second resin insulating layer 50 has a thickness (a2). As illustrated in FIG. 2, the thickness (a2) is a distance between the first conductor layer (158F) and the second conductor layer 58.

As illustrated in FIG. 2, the third resin insulating layer 350 has a thickness (a3). As illustrated in FIG. 2, the thickness (a3) is a distance between the second conductor layer 58 and the third conductor layer 358.

As illustrated in FIG. 2, the fourth resin insulating layers (170F) each have a thickness (a4). As illustrated in FIG. 2, the thickness (a4) is a distance between adjacent fourth conductor layers (178F).

The thickness (a1) is larger than the thickness (a2). The thickness (a2) is larger than the thickness (a3). The thickness (a4) is larger than the thickness (a3) (the thickness (a3) is smaller than the thickness (a4)). The thickness (a4) is smaller than the thickness (a2).

The thickness (a3) is the smallest among the thickness (a1), the thickness (a2), the thickness (a3) and the thickness (a4).

When a thickness of a resin insulating layer is small, strength of the resin insulating layer decreases. The strength of each of the first resin insulating layers (150F) is larger than the strength of the second resin insulating layer 50. The strength of the second resin insulating layer 50 is larger than the strength of the third resin insulating layer 350. The strength of each of the fourth resin insulating layers (170F) is larger than the strength of the third resin insulating layer 350. The strength of the second resin insulating layer 50 is larger than the strength of each of the fourth resin insulating layers (170F). The third resin insulating layer 350 has the smallest strength among the resin insulating layers (150F, 50, 350, 170F). Therefore, insulation resistance of the third resin insulating layer 350 is likely to decrease. Further, even when magnitudes of stresses in the resin insulating layers are the same, magnitudes of stresses per unit cross-sectional area are different depending on the thicknesses of the resin insulating layers. Therefore, when a stress in the first build-up layer (50F) is transmitted to the third build-up layer 70, the magnitude of the stress per unit cross-sectional area in the first resin insulating layers (150F) is different from the magnitude of the stress per unit cross-sectional area in the third resin insulating layer 350. The thickness (a3) is smaller than the thickness (a1). The magnitude of the stress per unit cross-sectional area in the third resin insulating layer 350 is larger than the magnitude of the stress per unit cross-sectional area in the first resin insulating layers (150F). Therefore, when a defect occurs in the resin insulating layers formed in the upper side build-up layer (Bu1), the insulation resistance of the third resin insulating layer 350 is likely to decrease. However, since the printed wiring board 10 of the embodiment has the second build-up layer 60, a stress can be relaxed by the second build-up layer 60. Further, the third resin insulating layer 350 is sandwiched between the second resin insulating layer 50 and the fourth resin insulating layers (170F). And, the strength of the second resin insulating layer 50 and the strength of each of the fourth resin insulating layers (170F) are higher than the strength of the third resin insulating layer 350. In this way, the third resin insulating layer 350 is sandwiched between the resin insulation layers having high strengths. The insulation resistance of the third resin insulating layer 350 is unlikely to decrease.

A ratio (a1/a2) of the thickness (a1) to the thickness (a2) is 2 or more and 3 or less. The ratio (a1/a2) is preferably 2.5 or more. A ratio (a2/a3) of the thickness (a2) to the thickness (a3) is 1.2 or more and 2 or less. The ratio (a2/a3) is preferably 1.5 or more. A ratio (a3/a4) of the thickness (a3) to the thickness (a4) is 0.7 or more and 0.9 or less. The ratio (a3/a4) is preferably 0.8 or more. A ratio (a2/a4) of the thickness (a2) to the thickness (a4) is 1.2 or more and 1.8 or less. The ratio (a2/a4) is preferably 1.3 or more.

It is preferable that the ratio (a1/a2) be 2.5, the ratio (a2/a3) be 1.7, the ratio (a3/a4) be 0.8, and the ratio (a2/a4) be 1.3. The connection reliability between the third via conductors 356 and the second conductor layer 58 can be increased. The connection reliability between the fourth via conductors (376F) and the third conductor layer 358 can be increased. The insulation resistance of the third resin insulating layer 350 can be increased.

The thickness (a1) is 20 µm or more and 30 µm or less. The thickness (a2) is 7.5 µm or more and 12.5 µm or less. The thickness (a3) is 4 µm or more and 9 µm or less. The thickness (a4) is 5 µm or more and 10 µm or less.

The insulation resistance of the third resin insulating layer 350 can be increased.

In the printed wiring board 10 of the embodiment, the resin insulating layers are reduced in thickness stepwise from the first build-up layer (50F) toward the third build-up layer 70. A stress is reduced stepwise. The resin insulating layers are gradually reduced in thickness. A stress is gradually reduced. A decrease in the insulation resistance of the third resin insulating layer 350 can be effectively suppressed.

The first via conductors (156F) penetrate the first resin insulating layers (150F). Therefore, a length of each of the first via conductors (156F) is about the same as the thickness (a1) of each of the first resin insulating layers (150F).

The second via conductors 56 penetrate the second resin insulating layer 50. Therefore, a length of each of the second via conductors 56 is about the same as the thickness (a2) of the second resin insulating layer 50.

The third via conductors 356 penetrate the third resin insulating layer 350. Therefore, a length of each of the third via conductors 356 is about the same as the thickness (a3) of the third resin insulating layer 350.

The fourth via conductors (376F) penetrate the fourth resin insulating layers (170F). Therefore, a length of each of the fourth via conductors (376F) is about the same as the thickness (a4) of each of the fourth resin insulating layers (170F).

The via conductors are reduced in length in the order of the first via conductors (156F), the second via conductors 56, the fourth via conductors (376F), and the third via conductors 356.

The via conductors are reduced in diameter in the order of the first via conductors (156F), the second via conductors 56 and the third via conductors 356. And, the diameter of the third via conductors 356 is about the same as the diameter of the fourth via conductors (376F).

From a point of view of the diameters of the via conductors, the third via conductors 356 and the fourth via conductors (376F) are likely to be affected by a stress. However, the third via conductors 356 have the smallest length among the via conductors (156F, 56, 356, 376F). Therefore, a damage to the third via conductors 356 due to a stress can be reduced. A stress reaching the fourth via conductors (376F) is relaxed by the first build-up layer (50F), the second build-up layer 60 and the third build-up layer 70. A damage to the fourth via conductors (376F) due to a stress can be reduced.

Examples of the dimensions illustrated in FIG. 2 are as follows.

The thickness (b1) is 15 μm, the thickness (b2) is 6 μm, the thickness (b3) is 4 μm, and the thickness (b4) is 2.5 μm.

The diameter (c1) is 50 μm, the diameter (c2) is 25 μm, the diameter (c3) is 10 μm, and the diameter (c4) is 10 μm.

The thickness (a1) is 25 μm, the thickness (a2) is 10 μm, the thickness (a3) is 6 μm, and the thickness (a4) is 7.5 μm.

The fourth conductor layers (178F) that form the fourth build-up layer 80 are each formed by the multiple fourth conductor circuits (178F1) and spaces (SP) between adjacent fourth conductor circuits (178F1). The fourth conductor circuits (178F1) each have a width (L). The width (L) is 2 μm or more and 4 μm or less. The spaces (SP) each have a width (S1). The width (S1) is 2 μm or more and 4 μm or less. The spaces (SP) and the widths (S1, L) are illustrated in FIG. 1.

The number of the resin insulating layers forming the lower side build-up layer (Bu2) is the same as the number of the resin insulating layers forming the first build-up layer (50F). The number of the conductor layers forming the lower side build-up layer (Bu2) is the same as the number of the conductor layers forming the first build-up layer (50F).

The thickness of each of the resin insulating layers forming the lower side build-up layer (Bu2) is the same as the thickness of each of the resin insulating layers forming the first build-up layer (50F). The thickness of each of the conductor layers forming the lower side build-up layer (Bu2) is the same as the thickness of each of the conductor layers forming the first build-up layer (50F). The diameter of each of the via conductors forming the lower side build-up layer (Bu2) is the same as the diameter of each of the via conductors forming the first build-up layer (50F).

The resin insulating layers forming the lower side build-up layer (Bu2) and the resin insulating layers forming the first build-up layer (50F) are formed of the same material.

The wiring board of Japanese Patent Laid-Open Publication No. 2014-154800 is formed by the base wiring board and the re-wiring part formed on the base wiring board. Then, diameters of via holes (VH1, VH2, VH3) formed in the base wiring board are 20 μm-60 μm, and diameters of via holes (VH4, VH5, VH6) formed in the re-wiring part are 10 μm-20 μm. In the wiring board of Japanese Patent Laid-Open Publication No. 2014-154800, the base wiring board and the re-wiring part are directly connected to each other. Therefore, when the wiring board of Japanese Patent Laid-Open Publication No. 2014-154800 is subjected to an impact such as a heat shock, a stress is thought to concentrate on an interface between the base wiring board and the re-wiring part. In Japanese Patent Laid-Open Publication No. 2014-154800, the diameters of the via holes in the base wiring board are greatly different from the diameters of the via holes in the re-wiring part. Therefore, connection reliability between the via holes formed in the re-wiring part and the base wiring board is expected to be reduced.

A printed wiring board according to an embodiment of the present invention includes a first build-up layer, a second build-up layer formed on the first build-up layer, a third build-up layer formed on the second build-up layer, and a fourth build-up layer formed on the third build-up layer. The first build-up layer has at least one first resin insulating layer, at least one first conductor layer formed on the at least one first resin insulating layer, and at least one first via conductor penetrating the at least one first resin insulating layer and connecting to the at least one first conductor layer. The second build-up layer has at least one second resin insulating layer, at least one second conductor layer formed on the at least one second resin insulating layer, and at least one second via conductor penetrating the at least one second resin insulating layer and connecting to the at least one second conductor layer. The third build-up layer has at least one third resin insulating layer, at least one third conductor layer formed on the at least one third resin insulating layer, and at least one third via conductor penetrating the at least one third resin insulating layer and connecting to the at least one third conductor layer. The fourth build-up layer has at least one fourth resin insulating layer, at least one fourth conductor layer formed on the at least one fourth resin insulating layer, and at least one fourth via conductor penetrating the at least one fourth resin insulating layer and connecting to the at least one fourth conductor layer. A thickness of the at least one first resin insulating layer is larger than a thickness of the at least one second resin insulating layer, the thickness of the at least one second resin insulating layer is larger than a thickness of the at least one third resin insulating layer, the thickness of the at least one second resin insulating layer is larger than a thickness of the at least one fourth resin insulating layer, and the thickness of the at least one fourth resin insulating layer is larger than the thickness of the at least one third resin insulating layer.

A printed wiring board according to an embodiment of the present invention has the first build-up layer, the second build-up layer formed on the first build-up layer, the third build-up layer formed on the second build-up layer, and the fourth build-up layer formed on the third build-up layer. And, the thickness of the at least one first resin insulating layer is larger than the thickness of the at least one second resin insulating layer. The thickness of the at least one second resin insulating layer is larger than the thickness of the at least one third resin insulating layer. The thickness of the at least one second resin insulating layer is larger than the thickness of the at least one fourth resin insulating layer. The thickness of the at least one fourth resin insulating layer is larger than the thickness of the at least one third resin insulating layer.

In this way, the embodiment has at least four build-up layers. And, in the build-up layers, the thicknesses of the resin insulating layers are different from each other. Therefore, even when the printed wiring board of the embodiment is subjected to an impact, a stress is thought to be dispersed to an interface between the first build-up layer and the second build-up layer, to an interface between the second build-up layer and the third build-up layer, and to an interface between the third build-up layer and the fourth build-up layer. Therefore, according to the printed wiring board of the embodiment, connection reliability at the interface between the first build-up layer and the second build-up layer is thought to be unlikely to decrease. Connection reliability at the interface between the second build-up layer and the third build-up layer is thought to be unlikely to decrease. Connection reliability at the interface between the third build-up layer and the fourth build-up layer is thought to be unlikely to decrease.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a first build-up layer comprising a first resin insulating layer, a first conductor layer formed on the first resin insulating layer, and a first via conductor penetrating through the first resin insulating layer and connecting to the first conductor layer;
   a second build-up layer formed on the first build-up layer and comprising a second resin insulating layer, a second conductor layer formed on the second resin insulating layer, and a second via conductor penetrating through the second resin insulating layer and connecting to the second conductor layer;
   a third build-up layer formed on the second build-up layer and comprising a third resin insulating layer, a third conductor layer formed on the third resin insulating layer, and a third via conductor penetrating through the third resin insulating layer and connecting to the third conductor layer; and
   a fourth build-up layer formed on the third build-up layer and comprising a fourth resin insulating layer, a fourth conductor layer formed on the fourth resin insulating layer, and a fourth via conductor penetrating through the fourth resin insulating layer and connecting to the fourth conductor layer,
   wherein the first resin insulating layer has a thickness that is larger than a thickness of the second resin insulating layer, the thickness of the second resin insulating layer is larger than a thickness of the third resin insulating layer, the thickness of the second resin insulating layer is larger than a thickness of the fourth resin insulating layer, the thickness of the fourth resin insulating layer is larger than the thickness of the third resin insulating layer, and the second build-up layer is formed such that a number of the second resin insulating layer in the second build-up layer is one and that a number of the second conductor layer in the second build-up layer is one.

2. The printed wiring board according to claim 1, wherein the first via conductor has a first via conductor diameter at an interface between the first conductor layer and the first via conductor, the second via conductor has a second via conductor diameter at an interface between the second conductor layer and the second via conductor such that the first via conductor diameter is larger than the second via conductor diameter, the third via conductor has a third via conductor diameter at an interface between the third conductor layer and the third via conductor such that the second via conductor diameter is larger than the third via conductor diameter, and the fourth via conductor has a fourth via conductor diameter at an interface between the fourth conductor layer and the fourth via conductor such that the second via conductor diameter is larger than the fourth via conductor diameter.

3. The printed wiring board according to claim 2, wherein the third and fourth build-up layers are formed such that the third via conductor diameter is substantially equal to the fourth via conductor diameter.

4. The printed wiring board according to claim 1, wherein the first, second, third and fourth build-up layers are formed such that a thickness of the first conductor layer is larger than a thickness of the second conductor layer, that the thickness of the second conductor layer is larger than a thickness of the third conductor layer, and that the thickness of the second conductor layer is larger than a thickness of the fourth conductor layer.

5. The printed wiring board according to claim 4, wherein the first build-up layer is formed such that the first resin insulating layer is formed in a plurality in the first build-up layer and that the first conductor layer is formed in a plurality in the first build-up layer, and the fourth build-up layer is formed such that the fourth resin insulating layer is formed in a plurality in the fourth build-up layer and that the fourth conductor layer is formed in a plurality in the fourth build-up layer.

6. The printed wiring board according to claim 1, wherein the third build-up layer is formed such that a number of the third resin insulating layer in the third build-up layer is one and that a number of the third conductor layer in the third build-up layer is one.

7. The printed wiring board according to claim 1, wherein the first build-up layer is formed such that the first resin insulating layer is formed in a plurality in the first build-up layer and that the first conductor layer is formed in a plurality in the first build-up layer, and the fourth build-up layer is formed such that the fourth resin insulating layer is formed in a plurality in the fourth build-up layer and that the fourth conductor layer is formed in a plurality in the fourth build-up layer.

8. The printed wiring board according to claim 7, further comprising:
- a core substrate having a first surface on which the first build-up layer is formed; and
- a lower side build-up layer formed on a second surface of the core substrate on an opposite side with respect to the first surface of the core substrate,
- wherein the lower side build-up layer comprises a plurality of fifth resin insulating layers, a plurality of fifth conductor layers formed on the fifth resin insulating layers respectively, and a plurality of fifth via conductors penetrating through the fifth resin insulating layers and connecting to the fifth conductor layers respectively, each of the fifth via conductors has a fifth via conductor diameter at an interface between the fifth conductor layer and the fifth via conductor such that the fifth via conductor diameter is substantially equal to the first via conductor diameter, the plurality of fifth conductor layers and the plurality of first conductor layers are formed such that a thickness of each of the fifth conductor layers is substantially equal to a thickness of each of the first conductor layers, the plurality of fifth resin insulating layers and the plurality of first resin insulating layers are formed such that a thickness of each of the fifth resin insulating layers is substantially equal to the thickness of each of the first resin insulating layers, and the lower side build-up layer is formed such that the plurality of fifth conductor layers has a number of layers equal to a number of layers of the plurality of first conductor layers, that plurality of fifth resin insulating layers has a number of layers equal to a number of layer of the plurality of first resin insulating layers, and that the lower side build-up layer is consisting of the plurality of fifth resin insulating layers, the plurality of fifth conductor layers and the plurality of fifth via conductors.

9. The printed wiring board according to claim 8, further comprising:
- an electronic component; and
- a motherboard,
- wherein the first build-up layer, the second build-up layer, the third build-up layer, and the fourth build-up layer form an upper side build-up layer on which the electronic component is mounted, and the motherboard is mounted on the lower side build-up layer.

10. The printed wiring board according to claim 9, wherein the upper side build-up layer comprises at least one metal post configured to mount the electronic component on the upper side build-up layer.

11. The printed wiring board according to claim 4, wherein the third and fourth build-up layers are formed such that the thickness of the third conductor layer is substantially equal to the thickness of the fourth conductor layer.

12. The printed wiring board according to claim 4, wherein the third and fourth build-up layers are formed such that the thickness of the third conductor layer is larger than the thickness of the fourth conductor layer.

13. The printed wiring board according to claim 4, wherein the third and fourth build-up layers are formed such that the thickness of the third conductor layer is smaller than the thickness of the fourth conductor layer.

14. The printed wiring board according to claim 2, wherein the first, second, third and fourth build-up layers are formed such that a thickness of the first conductor layer is larger than a thickness of the second conductor layer, that the thickness of the second conductor layer is larger than a thickness of the third conductor layer, and that the thickness of the second conductor layer is larger than a thickness of the fourth conductor layer.

15. The printed wiring board according to claim 6, wherein the first build-up layer is formed such that the first resin insulating layer is formed in a plurality in the first build-up layer and that the first conductor layer is formed in a plurality in the first build-up layer, and the fourth build-up layer is formed such that the fourth resin insulating layer is formed in a plurality in the fourth build-up layer and that the fourth conductor layer is formed in a plurality in the fourth build-up layer.

16. The printed wiring board according to claim 2, wherein the third build-up layer is formed such that a number of the third resin insulating layer in the third build-up layer is one and that a number of the third conductor layer in the third build-up layer is one.

17. The printed wiring board according to claim 2, wherein the first build-up layer is formed such that the first resin insulating layer is formed in a plurality in the first build-up layer and that the first conductor layer is formed in a plurality in the first build-up layer, and the fourth build-up layer is formed such that the fourth resin insulating layer is formed in a plurality in the fourth build-up layer and that the fourth conductor layer is formed in a plurality in the fourth build-up layer.

18. The printed wiring board according to claim 1, further comprising:
- a core substrate having a first surface on which the first build-up layer is formed; and
- a lower side build-up layer formed on a second surface of the core substrate on an opposite side with respect to the first surface of the core substrate,
- wherein the lower side build-up layer comprises a plurality of fifth resin insulating layers, a plurality of fifth conductor layers formed on the fifth resin insulating layers respectively, and a plurality of fifth via conductors penetrating through the fifth resin insulating layers and connecting to the fifth conductor layers respectively.

19. The printed wiring board according to claim 18, further comprising:
- an electronic component; and
- a motherboard,
- wherein the first build-up layer, the second build-up layer, the third build-up layer, and the fourth build-up layer form an upper side build-up layer on which the electronic component is mounted, and the motherboard is mounted on the lower side build-up layer.

20. The printed wiring board according to claim 19, wherein the upper side build-up layer comprises at least one metal post configured to mount the electronic component on the upper side build-up layer.

* * * * *